United States Patent [19]

Somer et al.

[11] Patent Number: 4,773,082

[45] Date of Patent: Sep. 20, 1988

[54] RF MODEM WITH IMPROVED BINARY TRANSVERSAL FILTER

[75] Inventors: Gerald L. Somer, Sebastopol; Patrick K. Walp, Penngrove, both of Calif.

[73] Assignee: AMP Incorporated, Harrisburg, Pa.

[21] Appl. No.: 931,576

[22] Filed: Nov. 17, 1986

[51] Int. Cl.⁴ .......................... H03K 1/02; G06F 7/38
[52] U.S. Cl. ..................................... 375/60; 364/724.16
[58] Field of Search ..................... 375/12, 14, 61, 11, 375/5, 91; 364/721, 724; 455/116; 307/585

[56] References Cited

U.S. PATENT DOCUMENTS

| | | | |
|---|---|---|---|
| 3,348,153 | 10/1967 | Featherston | 375/91 |
| 3,543,009 | 11/1970 | Voelcker, Jr. | 235/150.4 |
| 3,793,589 | 2/1974 | Puckette | 375/61 |
| 4,323,864 | 4/1982 | Ogawa et al. | 333/165 |
| 4,568,842 | 2/1986 | Koike | 307/585 |
| 4,573,166 | 2/1986 | Frederick | 375/9 |

FOREIGN PATENT DOCUMENTS

0015681  9/1980  European Pat. Off. .
WO86/03356  6/1986  PCT Int'l Appl. .

OTHER PUBLICATIONS

IEEE Transactions on Communication Technology, vol. COM-16, No. 1, 1968, pp. 81-93, "Generation of Digital Signal Wave Forms", by H. B. Volker.

IEEE Transactions on Communications, vol. COM-24, No. 11, 1976, pp. 1262-1268, "Transversal Filter Design and Application in Satellite Communications", by Feher and DeCristofaro.

*Primary Examiner*—Robert L. Griffin
*Assistant Examiner*—Andrew J. Telesz, Jr.
*Attorney, Agent, or Firm*—David L. Smith

[57] ABSTRACT

A binary transversal filter (200) in which the delay line of flip-flops (A-L, A'-L') is driven by timing signals (CLK, CLK*, CLKD, CLKD*) that are the same clock rate as the clock rate (CLK) of the encoded binary signals (IMPULSE 0, IMPULSE 1) being introduced into the delay line forming the binary transversal filters (200). The timing signal (CLK, CLK*, CLKD, CLKD*) that time or clock the stages of the delay line (A-L, A'-L') are phases of the clock (CLK) that introduces the encoded binary signals (IMPULSE 0, IMPULSE 1) into the delay line (A-L, A'-L'). Two substantially identical binary transversal filters (200a, 200b) are used to convert two encoded binary data streams (IMPULSE 0, IMPULSE 1) into a duobinary signal. The output of the two binary transversal filters (200a, 200b) are summed (Q2) and passed to a programmable amplifier (210), the gain of which is turned on when there is data in the encoded binary signals (IMPULSE 0, IMPULSE 1) to be converted and transmitted and is turned off otherwise. The carrier is prevented from being applied to the transmission medium (218) when the last bit of data in the encoded binary signals (IMPULSE 0, IMPULSE 1) has been converted to duobinary data by a binary transversal filter (200a, 200b) and applied to the medium (218). The encoded binary signal (IMPULSE 0, IMPULSE 1) inputted to the delay line (A-L, A'-L') of each binary transversal filter (200a, 200b) is monitored (25); the data shifted out of the last delay stage (L, L') of each binary transversal filter (200a, 200b) is also monitored (26). When the monitors (25, 26) indicated (27) that both encoded binary signals (IMPULSE 0, IMPULSE 1) are a logic 1 and the binary data shifted out of the last stage of delay (L, L') in both binary transversal filters (200a, 200b) are also both logic 1, all meaningful data has been converted to duobinary data and transmitted on the medium (218) and therefore the carrier may be turned off.

17 Claims, 7 Drawing Sheets

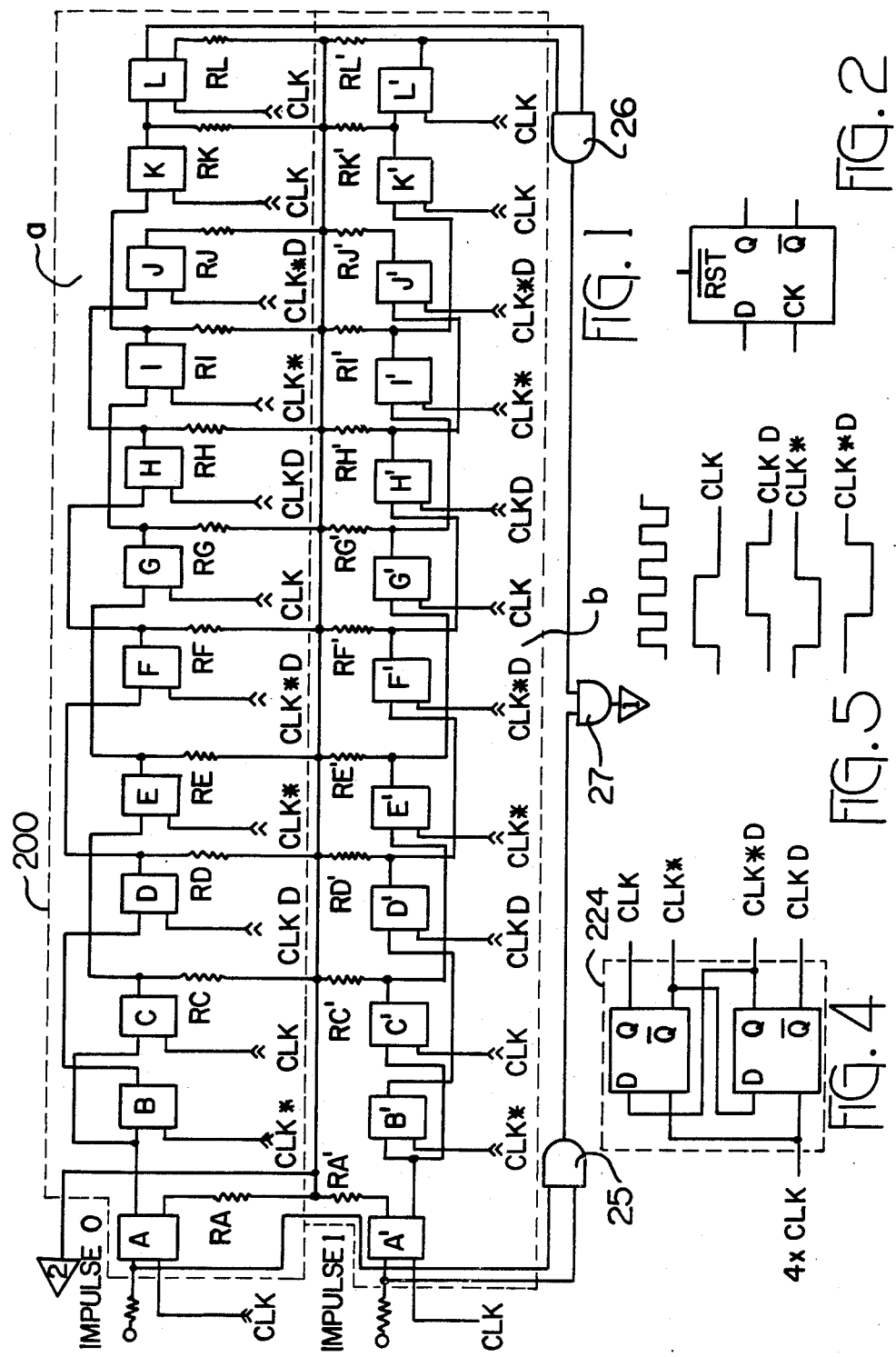

RF MODEM WITH IMPROVED BINARY TRANSVERSAL FILTER

The present invention is related to the following concurrently filed, copending applications, each of which is hereby incorporated by reference, all of which have been assigned to the same assignee as the present application and include:

Application Ser. No. 931,573, "RF Modem with Improved Clock Recovery Circuit", filed Nov. 17, 1986, by G. Somer;

Application Ser. No. 931,765, "RF Modem with Oscillator Switching Circuit", filed Nov. 17, 1986, issued Mar. 29, 1988, U.S. Pat. No. 4,734,657, by G. Somer; and Application Ser. No. 932,140, "Temperature Independent, Low Level, AM Modem Receiver", filed Nov. 17, 1986, issued Apr. 26, 1988, U.S. Pat. No. 4,740,996, by G. Somer.

BACKGROUND OF THE INVENTION

This invention relates to radio frequency modulation and in particular to a radio frequency modem having an improved binary transversal filter for converting encoded binary data into duobinary data.

In a transversal filter, a signal is passed through a delay line. A portion of the signal is tapped off at various points along the delay line and summed. The weight of the signal contribution to the sum at each tapped point can be changed as a variable; the location where the signal is tapped off along the delay line can also be changed as a variable. The sum of all of the weighted signals yields the output from the transversal filter. A binary transversal filter uses flip-flops to construct the delay line, such as a shift register, with the input to the delay line being a binary bit stream, binary vector or binary signal that ripples through the shift register.

A conventional binary transversal filter is disclosed in IEEE transactions on communication technology, Vol. COM-16, No. 1, 1968, pp. 81–93, "Generation of Digital Signal Wave Forms" by H. B. Volker, which is hereby incorporated by reference. In accordance wwith the disclosed binary transversal filter, the plurality of stages of shift registers are driven by timing signals, the frequency of which is M times greater than the frequency of the clock pulses of the signals being introduced into the shift register.

U.S. Pat. Nos. 3,543,009 and 4,323,864, both of which are hereby incorporated by reference, disclose binary transversal filters in which a plurality of shift registers are driven by timing signals at a frequency an integral multiple greater than the frequency of clock pulses of the signals being introduced into the shift register.

The above technique of using a clock frequency that is an integral multiple of the clock frequency of the signals being introduced into the shift register to drive the stages of the shift register cannot be utilized in a manufacturing automation protocol (MAP) modem designed in accordance with IEEE Standard 802.4 and employ complementary metal oxide semiconductors (CMOS) circuitry in the binary transversal filter delay line. The data transmission rate for a MAP modem is 10 megabits per second and thus a faster logic family would be required, a logic family such as emitter coupled logic. The shortcomings of these logic families is that the logic swing between a logic 0 and logic 1 does not go between two relatively well defined states such as ground and supply as the logic swing in the CMOS family of logic does. Thus, to use another logic family would necessitate additional buffers to establish a well defined voltage swing.

SUMMARY OF THE INVENTION

In accordance with the present invention, a binary transversal filter has a delay line of flip-flops that are driven by timing signals at the same frequency as the clock rate of the binary signal being introduced into the delay line forming the binary transversal filter. The timing signals that drive or clock the stages of the delay line are phases of the clock that introduces the binary signals into the delay line. Two substantially identical binary transversal filters are used to convert two encoded binary data streams into a duobinary signal. The output of the two binary transversal filters are summed and passed to a programmable amplifier, the gain of which is turned on when there is data in the encoded binary signals to be converted and transmitted and is turned off otherwise. The carrier is prevented from being applied to the transmission medium when the last bit of data in the encoded binary signals has been converted to duobinary data and applied to the transmission medium.

BRIEF DESCRIPTION OF THE DRAWING

FIG. 1 is a binary transversal filter in accordance with the present invention;

FIG. 2 shows a typical flip-flop used in the binary transversal filter of FIG. 1;

FIG. 4 is a schematic diagram showing the clock dividing circuit for producing the phases of the clock;

FIG. 5 shows the input signal to the clock dividing circuit and the phases of the clock produced by the dividing circuit;

DESCRIPTION OF THE PREFERRED EMBODIMENT

Figure 3A:
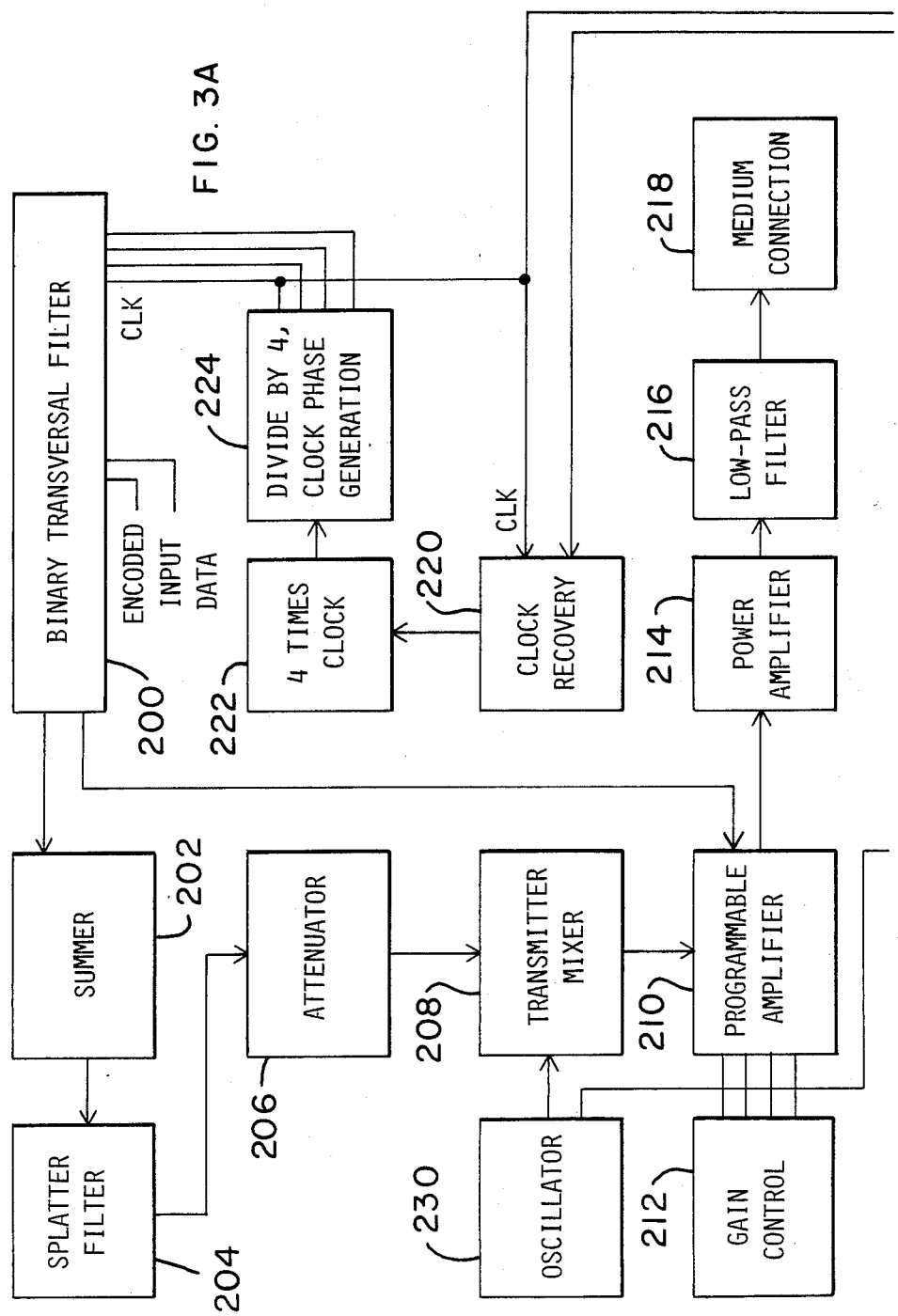
FIGS. 3A and 3B show respectively, in block diagram form, a radio frequency transmitter and receiver in which the binary transversal filter may be utilized.
Figure 3B:
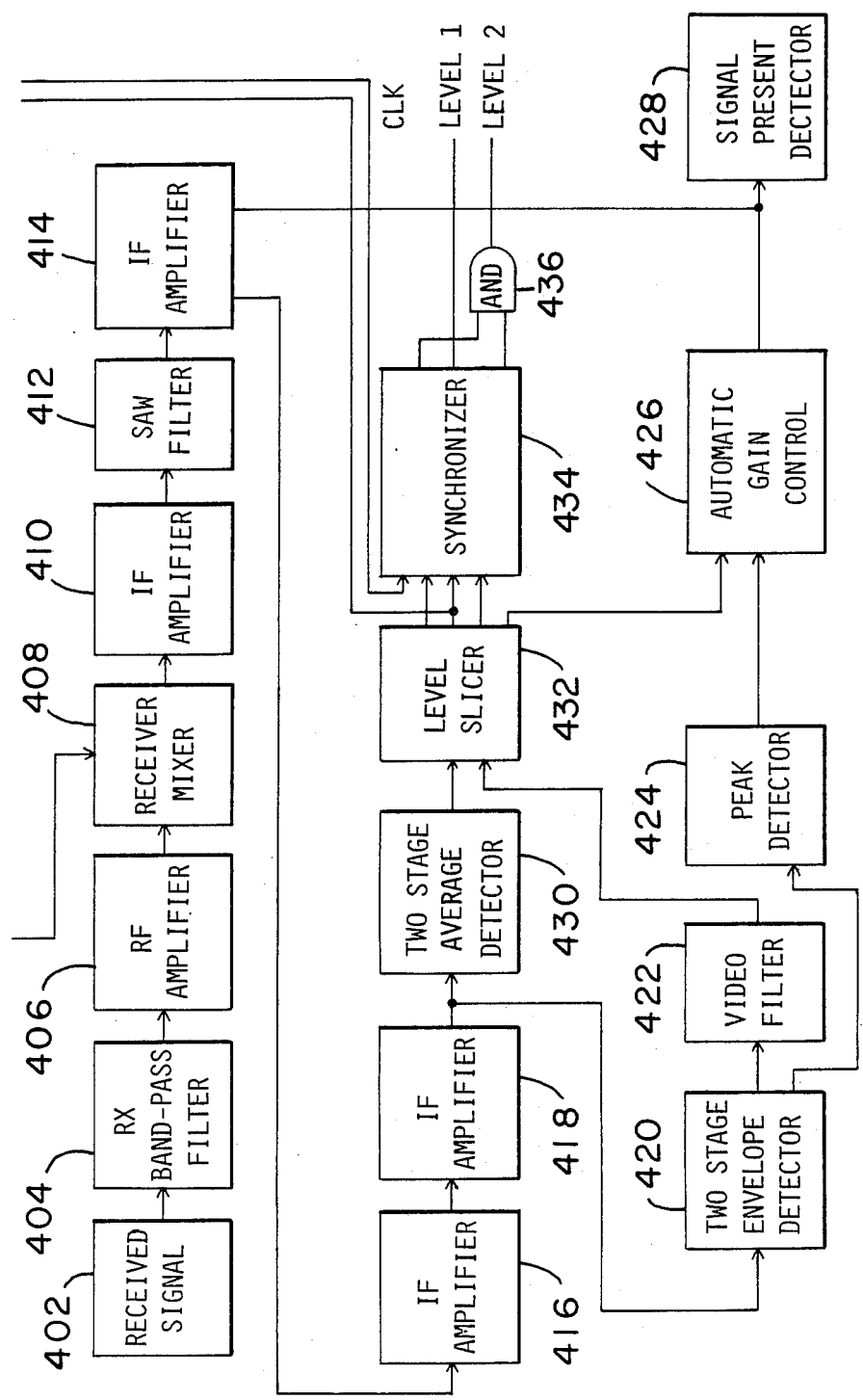

Referring to the drawing, initially to FIG. 1, there is depicted therein a binary transversal filter 200 in accordance with the present invention. Binary transversal filter 200 is comprised of two matching delay lines of flip-flops, A-L and A'-L', and converts two-level binary pulses into duobinary data. In a duobinary modulator, the incoming binary data stream passes through an encoder such as the broad band interface controller, not shown, manufactured by Motorola Incorporated, sold under Motorola Part No. MC68164 and described in the Motorola specification sheet relating to the aforesaid part number, said specification sheet which is hereby incorporated by reference. The encoder produces a pair of encoded binary bit streams, binary vectors or binary signals that are applied as input signals to a binary transversal filter for converting to duobinary data. The binary bit streams, IMPULSE 0 and IMPULSE 1, are the input signals to the first flip flop in each delay line, respectively flip flop A and A'. Each delay line of flip-flops A-L and A'-L' is a completely independent, identical binary transversal filter. One delay line is used to implement the PHY data symbols "0" and "4"; the other delay line is use to implement the PHY non-data symbols "0-2" and "2-4". When all of the symbols are present, the output of the binary transversal filter is a five level base band signal.

The two binary transversal filters, 200a and 200b that comprise binary transversal filter 200 are substantially identical. The outputs of binary transversal filters 200a and 200b are summed at a common point, the emitter of Q2, but could just as well have been formed separately as a contribution of binary transversal filters 200a and 200b then combined to form the summed output of binary transversal filter 200.

Figure 6:
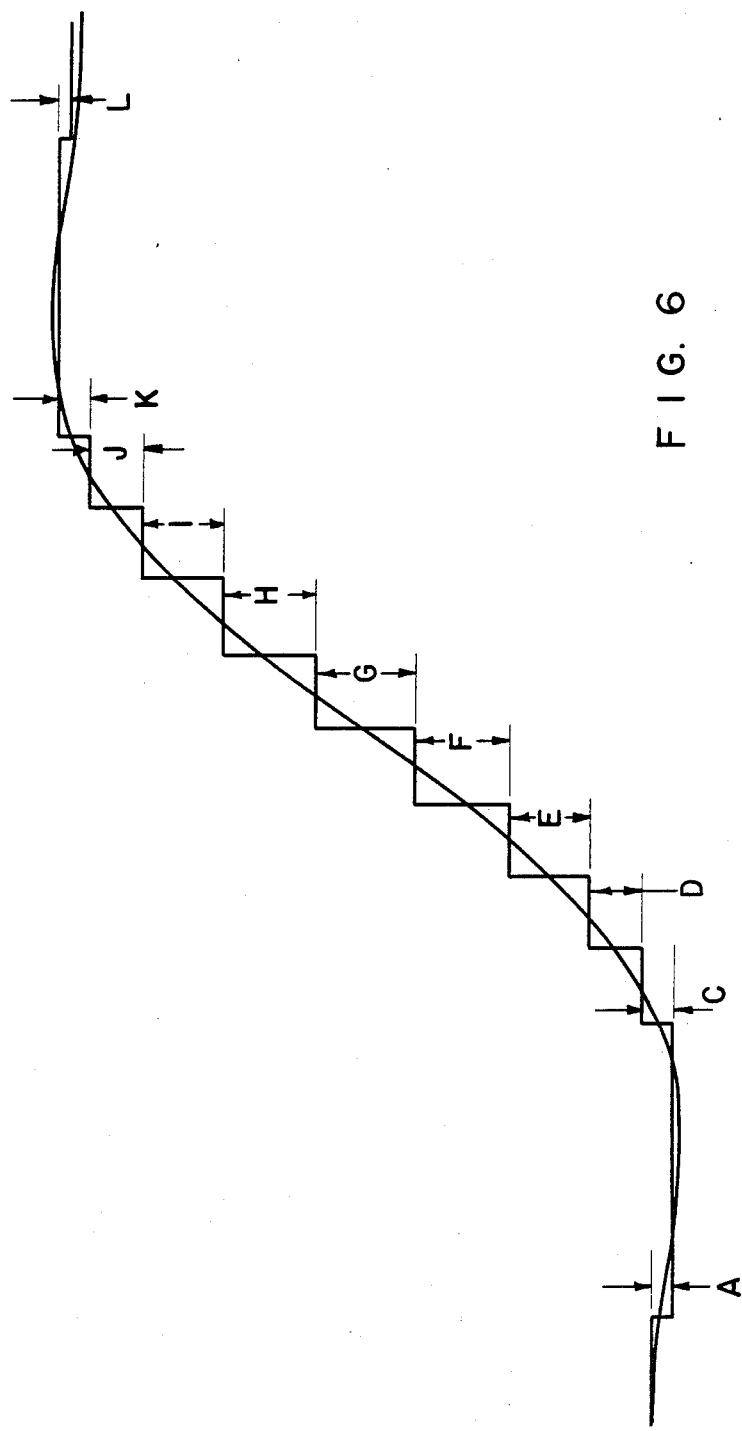
FIG. 6 shows the desired step response as well as a step-wise linear approximation thereof.

Binary transversal filter 200 implements in stair-step fashion the filter step response of FIG. 6. The stair-step of the preferred embodiment is superimposed on the filter step response of FIG. 6. The filter step response is calculated to result in a cosine-shaped output spectrum assuming a random data input pulse sequence.

In the preferred embodiment, the delay lines of flip-flops A-L and A'-L', are implemented using CMOS family logic because, for moderate loads, CMOS logic can drive a load over the logic swing of the logic family from ground to full supply voltage, thus providing operation between two well-defined voltage levels.

A typical flip flop used in the binary transversal filter 200 of FIG. 1 is shown in FIG. 2 as a D-type flip flop. Although the D-type flip flop is preferred, the invention is not limited thereto.

Figure 9:
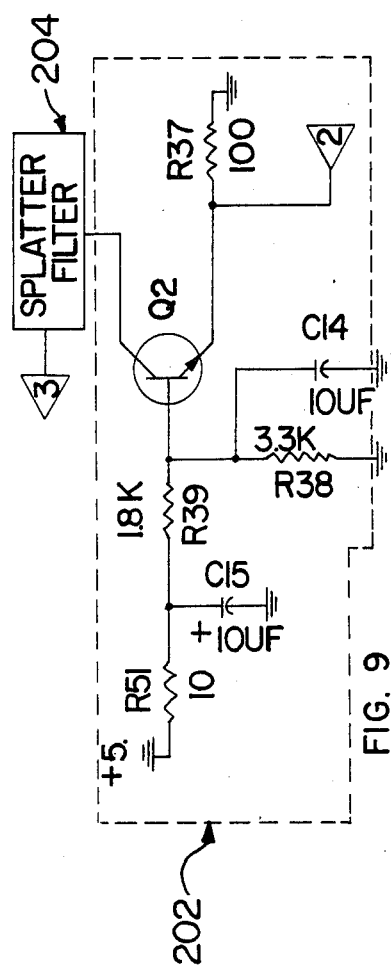
FIG. 9 is a schematic diagram of the summing circuit that sums the outputs of the individual stages of the binary transversal filter.
Figure 8:
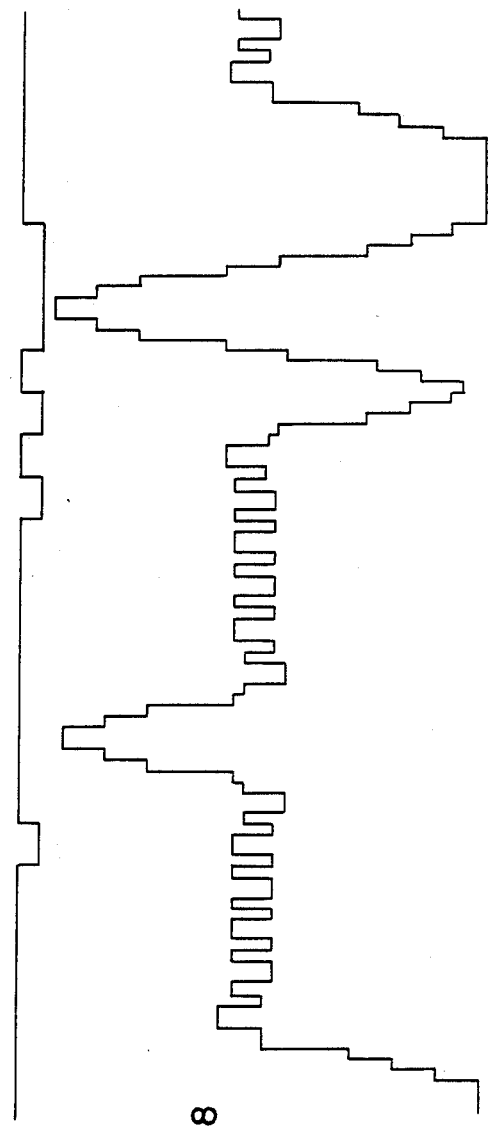
FIG. 8 is the sum of the weighted contributions of each stage of the binary transversal filter as shown in FIG. 7, representing the output of the binary transversal filter.

Each of the signal contribution weighing resistors RA-RL and RA'-RL' are connected between a flip flop output, Q or $\overline{Q}$ and a summing point, the emitter of transistor Q2 shown in FIG. 9. The resistors RA-RL and RA'-RL' represent means for weighing the contribution of each stage of the delay to the sum. The location of the resistors along the delay line determine the location where the delayed signal is tapped off of the delay line. The voltage at the emitter of current-to-voltage transistor Q2 is held at a fixed point between the power supply voltage and ground by the resistor voltage divider network, comprised of resistors R51, R38 and R39, on the base thereof. In a preferred embodiment, the summing point voltage, the emitter of transistor Q2, is held at a constant level of 50 percent of the supply voltage.

The emitter current of transistor Q2 varies due to the number and which of resistors RA-RL and RA'-RL' are switched into the filter circuit by the output state of the respective driving flip flop A-L and A'-L'. Due to the use of CMOS circuitry, the current supplied by each resistor in the delay line to the summing point is determined by the supply voltage and each resistor value.

Further, the binary transversal filter function is not dependent on supply voltage because the supply is common to all resistors, RA-RL and RA'-RL', and the summing point voltage, the emitter of transistor Q2 is held at a constant voltage level that is a fixed portion of the supply voltage. Therefore, the amplitude of the binary transversal output signal as summed at the emitter of transistor Q2 is dependent on the supply voltage but the filter function or shape of the output is only dependent on the relative magnitudes of resistors RA-RL and RA'-RL'. Thus, the relative values of resistances are important to define the weighting or contribution of the output of each stage of the delay to the output of the binary transversal filter. Precision resistors are typically used. The smaller a resistor RA-RL and RA'-RL' relative to the other resistors, the larger that resistors contribution to the sum at the emitter of transistor Q2.

The resistance values are determined such that the current load on transistor Q2 is approximately 25 milliamps plus or minus 20 milliamps so that transistor Q2 operates within its linear range over the expected range of summed current contributed by resistors RA-RL and RA'-RL'. The relative magnitudes RA-RL and RA'-RL' are determined from the step-wise approximation of the binary transversal filter step response shown in FIG. 6.

The location, number and magnitude of the steps of the step-wise approximation determines the number of stages in the delay line of the binary transversal filter and the number of resistors required. Advantage of the binary transversal filter step response symmetry is utilized to provide a best fit step-wise approximation that itself has symmetry. This results in an odd number of steps in the step-wise approximation, one corresponding to each of the number of stages of delay in the binary transversal filter that contribute to the weighted sum. The relative heights of the vertical line segments in the step-wise approximation corresponds to the relative magnitude of the resistors having the same letter designation. The vertical line segments are established to create approximate equal areas in the triangular areas adjacent to the line segment above and below the curve being approximated. The vertical line segments are spaced horizontally at substantially equal spaced intervals, or in multiples thereof, to accommodate timing of the stages of the delay line comprising the binary transversal filter. A binary transversal filter could be designed to have a uniform height step size with a variable number time increments per vertical line segment or step. Due to the symmetry of the binary transversal filter step response curve and the identical structure of the two delay lines, the resistor network RA-RL has symmetry and is identical to the resistor network RA'-RL'. Some of the resistance values may vary slightly from the theoretical as once the filter is tested it may be desired to adjust some of the resistance values to fine tune the output of the binary transversal filter.

As stated above, to take advantage of the symmetry of the binary transversal filter step response being step-wise approximated, resulted for a best fit approximation in an odd number of stages in the delay lines of the binary transversal filter. In a preferred embodiment, the number of stages is an odd number and further 11 in number, however the invention is not limited thereto as the number of stages of delay may be any number, odd or even, and is only limited by practical consideration such as limiting the hardware to fabricate the resulting binary transversal filter and the accuracy of the response to a binary transversal filter with a given number and magnitude of steps in the the step-wise approximation to the desired curve.

Generally, the contribution of the given stage of delay A-L or A'-L' will contribute positively to the sum at the emitter of transistor Q2 if tapped off of the Q output of the corresponding flip flop and negatively if tapped off of the $\bar{Q}$ output of the corresponding flip flop. It is noted that the contribution of flip flop A′ to the sum at the emitter of transistor Q2 decreases in FIG. 6, therefore is a negative contribution to the sum and is also shown as subtracting from the sum in FIG. 7 yet but from the above analysis it would appear that the contribution of flip flop A′ contributes positively to the sum. The same analysis may be used for flip-flops B′–L′. In the embodiment disclosed in FIG. 1, an inverting amplifier that would otherwise be necessary to invert the IMPULSE 1 data before inputting the inverted data to flip flop A′ has been eliminated and the contribution from flip flop A′ to sum at the emitter of transistor Q2 taken from the Q output with the data shifting out of flip flop A′ to subsequent stages of the delay line being taken from the $\bar{Q}$ output. Flip flops B and B′ do not contribute to the amplitude output of their associated delay line but introduce a time delay.

In the preferred embodiment, resistors RA–RL and RA′–RL′ have the values shown in Table I below:

TABLE 1

| Resistors | Resistance in ohms |
|---|---|
| RA, RA′, RL, RL′ | 6.19K |
| RC, RC′, RK, RK′ | 4.87K |
| RD, RD′, RJ, RJ′ | 2.67K |
| RE, RE′, RI, RI′ | 1.82K |
| RF, RF′, RH, RH′ | 1.56K |
| RG, RG′ | 1.43K |

Each of the flip-flops A–L and A′–L′ in the binary transversal filter is driven by timing signals at the same clock rate or frequency as the clock rate of the binary signals being introduced into the delay line. The timing signals that drive the stages of the delay line are phases of the clock that introduces the binary signals into the delay line. The head end is required to be the source of all data timing on a network designed in accordance with IEEE Specification 802.4. The recovered clock signal is developed by clock recovery circuit 220 of modem 10. Clock recovery circuit 220 produces as one output a signal 4×CLK that is at a clock rate four times the embedded clock in received data. The 4×CLK signal is divided in a clock dividing circuit 224 as shown in FIG. 4 for producing four phases of the clock. The 4×CLK signal as well as the four phases of the clock signal are shown in FIG. 5. The clock signal is identified by CLK. CLKD represents the clock delayed by 90 degrees. CLK* represents the clock signal, CLK, inverted. CLK*D represents the delayed clock signal inverted. In this manner, four phase related timing signals are generated at the same frequency as the clock rate of the signals being introduced into the first flip flop of each delay line with each phase related timing signal having a rising edge at mutually spaced phases. Using other than four phases of the clock is contemplated within the scope of the invention.

The various phases of the CLK signal provide the timing or clock inputs for each of the stages of the two delay lines of the binary transversal filters. The appropriate clock phase is provided to each flip flop A–L and A′–L′ as indicated in FIG. 2 and is evident from FIG. 7, to ripple or shift through the delay lines the encoded binary data clocked into flip-flops A and A′.

The binary data shifting out of the final delay stage in the binary transversal filters, flip-flops L and L′, has made its contribution to the synthesized wave form sum at the emitter of transistor Q2 and has been placed on the medium for transmission. When the final bit of data is shifted out of the final stage of both delay lines, the transmitter carrier signal may be turned off. Each binary transversal delay line as shown in FIG. 1 has 2.5 bit delay.

Figure 7:
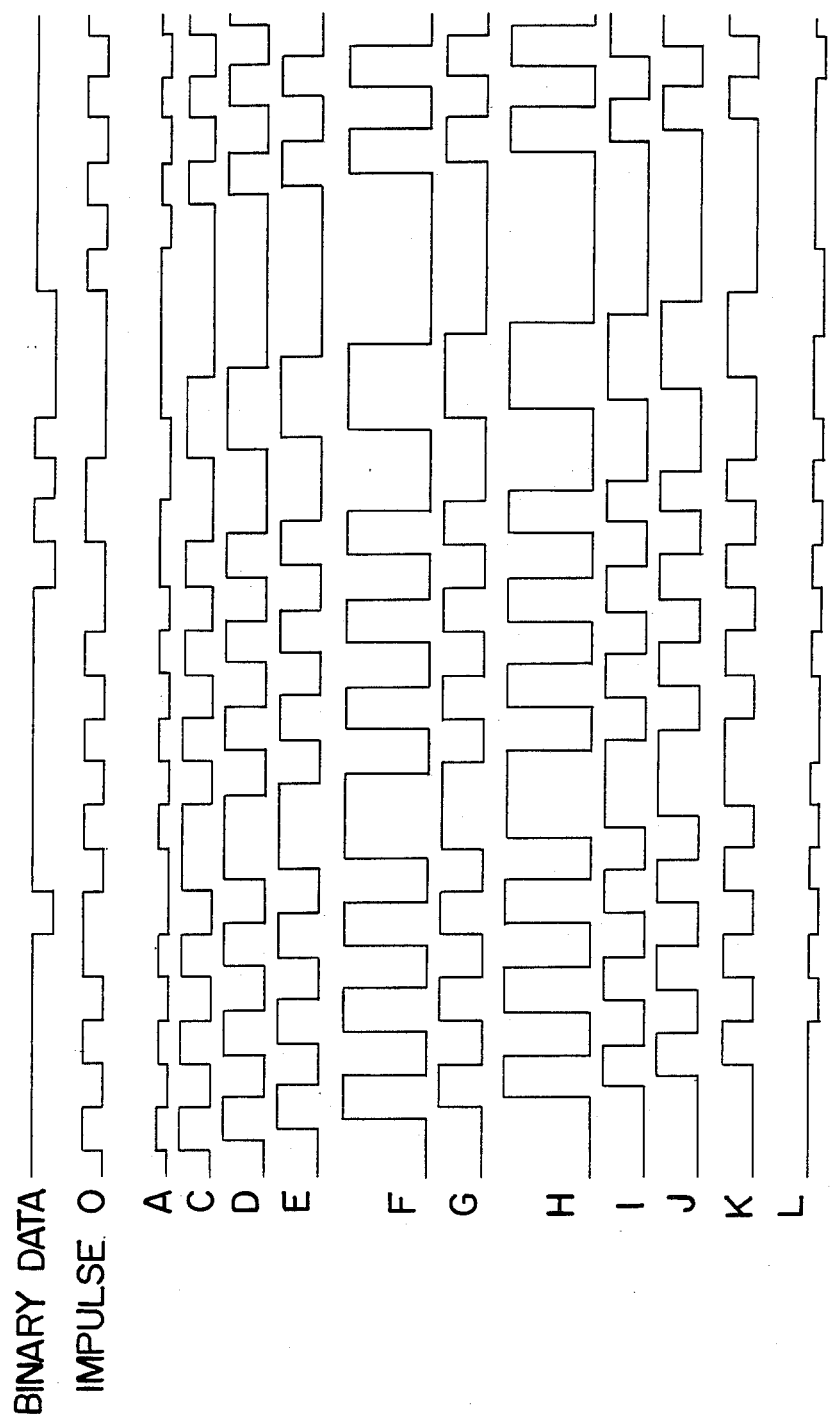
FIG. 7 shows a random data stream, the corresponding encoded data input to the binary transversal filter and the contribution to the sum of the output of each stage in the filter.

The delay introduced by a particular delay line depends upon how the delay line is implemented; the invention is not limited to a 2.5 bit delay. The delay necessary to assure that the final bit of data has been shifted out of flip flop L or L′ may be derived from the delay line itself. When all data has been transmitted, SILENCE represented by both IMPULSE 0 and IMPULSE 1 being a logical one is transmitted. The transmitter carrier can be turned off when the bit preceding SILENCE has passed through the delay lines and is transmitted on the medium. As shown in FIG. 1, AND gate 25 monitors when both IMPULSE 0 and IMPULSE 1 are a logic one and as such provides means for detecting when both input data streams being shifted into the delay lines are a logic one, by producing at its output a logic one. AND gate 26 monitors when the bit being shifted out of the last stage of delay in both delay lines is a logic one and as such provides means for detecting the data being shifted out of the delay lines are a logic one by producing at its output a logic one. FIG. 7 shows a stream of binary data and the corresponding encoded IMPULSE 0 signal. On the same time axes are shown the contribution of each of flip-flops A through L to the summed output of the binary transversal filter at the emitter of transistor Q2. The amplitude of each flip-flops contribution to the sum is represented by the vertical portion of the curve adjacent the corresponding flip flop identifying letter. The amplitude of the output of flip flop G is shown in half scale. The height of the contribution of each flip flop A through L in FIG. 7 corresponds to the vertical line segment of the same letter in FIG. 6. Each flip flop A–L and A′–L′ is clocked by the rising edge of the clock signal associated therewith.

When the output of both AND gates 25 and 26 are high, the output of AND gate 27 goes high indicating that SILENCE has been transmitted for a sufficiently long time period that all meaningful data has had time to ripple through the delay line and make its contribution to the sum at the emitter of transistor Q2 and therefore the transmitter carrier signal may be turned off.

Figure 10:
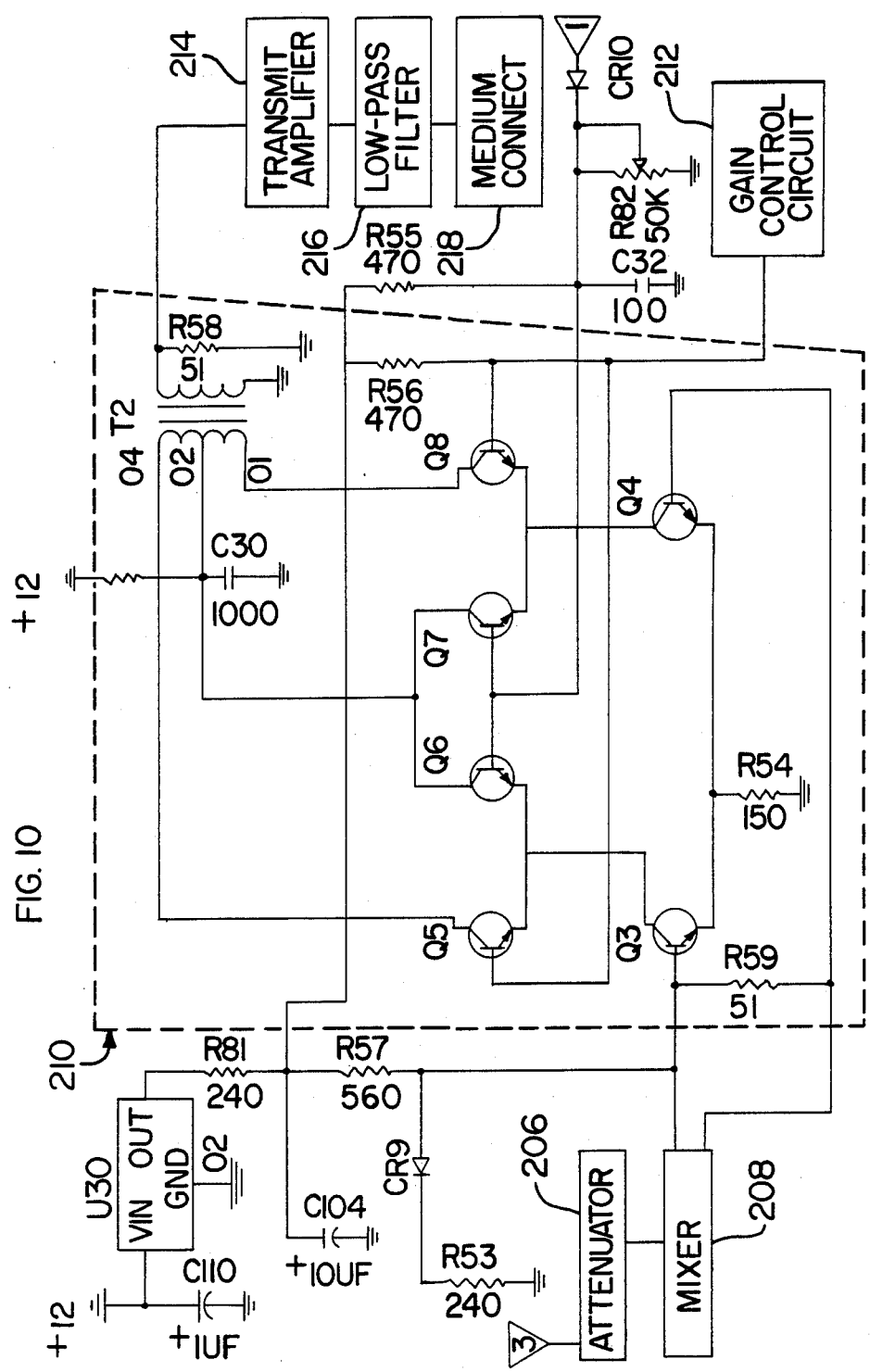
FIG. 10 is a schematic diagram of the programmable amplifier shown in FIG. 3A.

Programmable amplifier 210 is a balanced amplifier that receives a logic input from AND gate 27 and uses the logic input to turn the carrier on and off. There are no transients in the output of programmable amplifier 210 as they are balanced out due to the common mode design. Programmable amplifier 210 is shown in block diagram form, as part of modem 10 in FIG. 3A and shown in greater detail in FIG. 10. The duobinary signal that enters mixer 208 through attenuator 206 from the emitter of transistor Q2 is a base band signal that ranges from near DC to up to 5 MHz for a 10 megabit modem. The carrier signal is at a radio frequency as generated by oscillator 230. Mixer 208 translates the video modulation up to the selected one of three radio frequency channels. The same spectrum is generated in the RF channel, displaced by the carrier frequency.

Mixer 208 provides two inputs to programmable amplifier 210 which are applied to the base of transistors Q3 and Q4. The gain of programmable amplifier 210 is programmable such as by inputting the binary control to gain control circuit 212 which modifies the bias on programmable amplifier 210 and in turn changing the bias current and hence the gain. When the gain of programmable amplifier 210 is maximum, all of the bias current is shared equally and applied to the base of transistors Q5 and Q8. The balanced output is transformed through transformer T2 where the entire signal will be passed on to transmit amplifier 214.

Where the gain is maximum, there is no current in the base of transistors Q6 and Q7 and therefore all of the doubinary signal applied to programmable amplifier 210 is applied to the base of transistors Q5 and Q8 which operate as a balanced amplifier such that their output signals appear on their respective collectors in push-pull fashion with the output being coupled through transformer T2 as pins 1 and 4 thereof are driven push-pull fashion.

At the other extreme, when the gain control circuit 212 controls the gain of programmable amplifier 210 to be minimum which is the other extreme, all of the bias current is applied to the base of transistors Q6 and Q7 thereby saturating and turning on transistors Q6 and Q7. When transistors Q6 and Q7 are turned on, all of the amplifier output current goes through the center tap of transformer T2 is balanced out, and therefore cannot be transformed through transformer T2 to transmit amplifier 214. Where there is no gain to programmable amplifier 210 or the gain thereof is minimum, transistors Q6 and Q7 are turned on and transistors Q5 and Q8 are turned off. All of the signal supplied by mixer 208 appears at the center tap, pin 2, of transformer T2. Since the center tap cannot drive the transformer no signal is transformed to transmit amplifier 214. To assure that no signal passes through from the center tap, the center tap is grounded through capacitor C30. In between the two extremes of gain, programmable amplifier 210 provides a variable range of gain.

Programmable amplifier 210 is a balanced amplifier that provides lower distortion than a non-balanced amplifier. Furthermore the balanced amplifier allows the carrier to be turned completely off. Since a single transistor cannot be completely turned off, any incomplete turn off of either transistor in a balanced amplifier can be used to cancel the lack of turn off of the other transistor.

In addition to gain control circuit 212 turning off the carrier, the carrier is also turned off when the output of AND gate 27 goes high. The output of AND gate 27 going high indicates that SILENCE is being received by the delay lines and SILENCE has ripped through the delay lines. When AND gate 27 goes high, diode CR10 is turned on which causes bias current to enter the base of transistors Q6 and Q7 of programmable amplifier 210. This prevents the carrier from being applied to the transmission medium by redirecting the carrier to ground through capacitor C30. In this manner, the carrier is not permitted to pass through transformer T2 thence to the medium as long as SILENCE is being both received by and rippled through the delay lines. When SILENCE in the input signals is replaced by data to be transmitted, the output of AND gate 25 goes low driving the output of AND gate 27 low turning off CR10, removing the bias current from the base of transistors Q6 and Q7 thus permitting the carrier to be transformed through transformer T2 and be applied to the medium 218 without any delay.

Binary transversal filters 200a and 200b convert incoming encoded data streams to duobinary data. The output of binary transversal filters 200a and 200b are summed by summer 202. The duobinary output of summer 202 is passed through splatter filter 204 to smooth the curve produced by binary transversal filter 200. The smoothed curve is applied to attenuator 206 to provide a well defined load for the splatter filter, set the normal transmitter radio frequency output level and prevent the overload of the mixer 208 baseband signal. Mixer 208 maps the five level baseband signal received from the attenuator into a three level carrier signal. The carrier input to mixer 208 originates from oscillator 230 and is centered on one of the transmit channels produced by oscillator 230.

Programmable amplifier 210 and gain-control circuit 212 are described above; the output thereof is amplified by power amplifier 214, filtered by low pass filter 216 to attenuate transmitter harmonics and applied to the transmission medium 218.

We claim:

1. A binary transversal filter for receiving input signals synchronously with the pulses of an input signal clock, comprising:
   clock phase generating means for receiving the pulses of the input signal clock and for generating a plurality of timing signals that are various phases of the input signal clock;
   a delay line to which the input signals are provided, said delay line including a plurality of stages which are clocked by the timing signals that are said various phases of the input signal clock generated by the clock phase generating means in order to shift the input signals through said delay line, each stage of the delay line providing an output;
   weighting means for weighting the output of each of the stages of the delay line; and
   summing means for summing the weighted outputs of the stages of the delay line to synthesize a summed output.

2. A binary transversal filter as recited in claim 1 wherein the delay line comprises a plurality of flip-flops.

3. A binary transversal filter as recited in claim 2 wherein the weighting means is comprised of resistors, said resistors tied between an output of a flip-flop and the summing means.

4. A binary transversal filter as recited in claim 3 wherein the relative magnitude of the resistors determines the contribution of each stage of the delay line to the summed output.

5. A binary transversal filter as recited in claim 2 wherein the flip-flops are from the CMOS logic family.

6. A binary transversal filter as recited in claim 2 wherein the flip-flops are D-type flip-flops.

7. A binary transversal filter as recited in claim 1 wherein the delay line is clocked by timing signals in which the number of phases of the input signal clock is a power of two.

8. A binary transversal filter as recited in claim 7 wherein the delay line is clocked by timing signals that are four phases of the input signal clock.

9. A binary transversal filter as recited in claim 1 wherein the delay line is comprised of an odd number of stages that contribute to the summed output.

10. A binary transversal filter as recited in claim 9 wherein the number of stages that contribute to the summed output is eleven.

11. A binary transversal filter as recited in claim 1 wherein the delay line is a shift register.

12. A radio frequency transmitter having a binary transversal filter for receiving the input signals synchronously with the pulses of an input signal clock, comprising:
   clock phase generating means for receiving the pulses of the input signal clock and for generating a plurality of timing signals that are various phases of the input signal clock;
   a delay line to which the input signals are provided, said delay line including a plurality of stages which are clocked by the timing signals that are said various phases of the input signal clock generated by the clock phase generating means in order to shift the input signals through said delay line, each stage of the delay line providing an output;
   weighting means for weighting the output of each stage of the stages of the delay line; and
   summing means for summing the weighted outputs of the stages of the delay line to synthesize a summed output.

13. A radio frequency transmitter having a binary transversal filter for receiving input signals synchronously with the pulses of an input signal clock, comprising:
   clock phase generating means for generating a plurality of timing signals that are various phases of the input signal clock;
   a pair of shift registers, each of which is provided with an input signal, said shift registers each including a plurality of stages which are clocked by the timing signals that are said various phases of the input signal clock generated by the clock phase generating means in order to shift the input signals through said shift registers, each stage of the shift registers providing an output;
   a weighting function for weighting the output of each of the stages of each of the shift registers; and
   summing means for summing the weighted outputs of the stages of the shift registers to define a summed output.

14. A radio frequency transmitter as recited in claim 13 further comprising:
   means for detecting when both input signals being shifted into the first of the plurality of stages of shift registers are logic 1; and
   means for detecting when the input signals being shifted out of the last of the plurality of stages of shift registers are logic 1.

15. A radio frequency transmitter as recited in claim 14 further comprising a variable gain amplifier for receiving the summed output of the summing means, the gain of said amplifier being turned off when both input data streams to the first of the plurality of stages of shift registers are logic 1 and both input signals being shifted out of the last of the plurality of stages of shift registers are logic 1 as detected by the respective detecting means, and the gain of said amplifier being turned on otherwise.

16. A radio frequency transmitter as recited in claim 13 further comprising means for detecting when all meaningful data in the input signals has been shifted into the last stage of the respective shift registers.

17. A radio frequency transmitter as recited in claim 13 wherein the shift registers comprise delay lines.

* * * * *